United States Patent
Cooper et al.

(10) Patent No.: US 7,498,633 B2
(45) Date of Patent: Mar. 3, 2009

(54) HIGH-VOLTAGE POWER SEMICONDUCTOR DEVICE

(75) Inventors: James A. Cooper, West Lafayette, IN (US); Asmita Saha, Hillsboro, OR (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 11/338,007

(22) Filed: Jan. 23, 2006

(65) Prior Publication Data

US 2006/0192256 A1 Aug. 31, 2006

Related U.S. Application Data

(60) Provisional application No. 60/646,152, filed on Jan. 21, 2005.

(51) Int. Cl.
*H01L 29/94* (2006.01)
(52) U.S. Cl. .................... 257/341; 257/263; 257/256
(58) Field of Classification Search .............. 257/263, 257/256, 341, 342, 335, 339, 350; 438/142, 438/156, 176, 186, 197, 268
See application file for complete search history.

(56) References Cited

U.S. PATENT DOCUMENTS

| 5,137,139 A * | 8/1992 | Ruscello ............ 198/460.1 |
| 5,545,908 A * | 8/1996 | Tokura et al. ............ 257/341 |
| 6,137,139 A * | 10/2000 | Zeng et al. ............ 257/342 |
| 6,552,391 B2 * | 4/2003 | Zeng et al. ............ 257/342 |
| 6,573,534 B1 * | 6/2003 | Kumar et al. ............ 257/77 |
| 2003/0052329 A1 * | 3/2003 | Kobayashi et al. .......... 257/135 |
| 2003/0205829 A1 * | 11/2003 | Boden, Jr. ............ 257/921 |
| 2003/0227052 A1 * | 12/2003 | Ono et al. ............ 257/341 |

* cited by examiner

*Primary Examiner*—Zandra Smith
*Assistant Examiner*—Paul E Patton
(74) *Attorney, Agent, or Firm*—Barnes & Thornburg LLP

(57) ABSTRACT

A semiconductor device, such as a metal-oxide semiconductor field-effect transistor, includes a semiconductor substrate, a drift layer formed on the substrate, a first and a second source region, and a JFET region defined between the first and the second source regions. The JFET region may have a short width and/or a higher concentration of impurities than the drift layer. The semiconductor device may also include a current spreading layer formed on the drift layer. The current spreading layer may also have a higher concentration of impurities than the drift layer.

15 Claims, 4 Drawing Sheets

HIGH-VOLTAGE POWER SEMICONDUCTOR DEVICE

This patent application claims priority to and the benefit of U.S. Provisional Patent Application Ser. No. 60/646,152 entitled "Optimized Vertical Power DMOSFETs in Silicon Carbide" which was filed on Jan. 21, 2005, the disclosure of which is expressly incorporated herein by reference

TECHNICAL FIELD

The present disclosure relates generally to semiconductor devices, and more particularly to semiconductor devices for high-voltage power applications.

BACKGROUND

One design consideration in the fabrication of semiconductor devices, such as metal-oxide semiconductor field-effect transistors (MOSFETs), for high-voltage power applications is the blocking voltage of the semiconductor device. The blocking voltage is defined as the drain-to-source voltage of the semiconductor device at which avalanche breakdown occurs and/or the strength of the magnetic field of the gate oxide at which the gate oxide fails. As such, for high-voltage power applications, a high blocking voltage is generally desirable. Another design consideration in such applications is the specific on-resistance of the semiconductor device (i.e., the product of the resistance of the device between the source and drain when the device is in an on-state and the area of the device, typically measured in $m\Omega\text{-}cm^2$). As the specific on-resistance of the device decreases, the efficiency of the semiconductor device may be improved. However, the typical fabrication techniques for reducing the specific on-resistance of high-voltage power semiconductor devices may also reduce the blocking voltage of the device.

SUMMARY

A metal-oxide semiconductor field-effect transistor (MOSFET) may include a semiconductor substrate. The semiconductor substrate may have a first concentration of first type impurities such as, for example, N-type impurities. The semiconductor substrate may be formed from a silicon carbide material. The MOSFET may include a drift semiconductor layer formed on a front side of the semiconductor substrate. The drift semiconductor layer may be so formed by epitaxially growing the drift semiconductor layer on the front side of the semiconductor substrate. The drift semiconductor layer may have a second concentration of first type impurities less than the first concentration of first type impurities. For example, the drift semiconductor layer may have a concentration of first type impurities of about $1\times10^{16}$ $cm^{-3}$ or less. The MOSFET may also include a first source region, a second source region, and a junction field-effect transistor (JFET) region defined therebetween. The JFET region may be defined, for example, under a gate electrode of the MOSFET. The JFET region may have a third concentration of first type impurities that is greater than the second concentration of first type impurities. For example, the third concentration of first type impurities may be at least one order of magnitude greater than the second concentration of first type impurities. In one particular embodiment, the JFET region may have a concentration of first type impurities of about $1\times10^{17}$ $cm^{-3}$ or greater. The JFET region may have a width less than about three micrometers. For example, the JFET may have a width of about one micrometer.

The MOSFET may also include a current spreading semiconductor layer formed on a front side of the drift semiconductor layer and, in some embodiments, under other base layers. The current spreading semiconductor layer may be so formed by, for example, epitaxially growing the current spreading semiconductor layer formed on a front side of the drift semiconductor layer. The current spreading semiconductor layer may have a fourth concentration of first type impurities greater than the second concentration of first type For example, the fourth concentration of first type impurities may be at least one order of magnitude greater than the second concentration of first type impurities. In one particular embodiment, the current spreading semiconductor layer may have a concentration of first type impurities of about $1\times10^{17}$ $cm^{-3}$ or greater.

The MOSFET may further comprise a plurality of base contact regions formed in each of the first and the second source regions. The base contact regions being smaller than the first and second source regions. Alternatively, the MOSFET may further include a plurality of source regions and a plurality of base contact regions. The plurality of source regions and the plurality of base contact regions may form alternating strips of N-type doped regions and P-type doped regions. The alternating strips being substantially orthogonal to respective source electrodes formed over the first and the second source regions. The MOSFET may be a double-implanted MOSFET (DMOSFET). For example, the MOSFET may be a vertical DMOSFET.

A double-implanted metal-oxide semiconductor field-effect transistor (DMOSFET) may include a semiconductor substrate. The semiconductor substrate may be formed from silicon-carbide. The DMOSFET may include a drift semiconductor layer formed on a front side of the semiconductor substrate. The drift semiconductor layer may be so formed by epitaxially growing the drift semiconductor on the front side of the semiconductor substrate. The drift semiconductor layer may have a concentration of first type impurities less than a concentration of first type impurities of the semiconductor substrate. The DMOSFET may also include a first source region, a second source region, and a JFET region defined therebetween. The JFET region may have a concentration of first type impurities that is greater than the concentration of first type impurities of the drift semiconductor layer. For example, the concentration of first type impurities of the JFET region may be at least one order of magnitude greater than the concentration of first type impurities of the drift semiconductor layer The JFET region may also have a width less than about three micrometers. For example, the JFET may have a width of about one micrometer. Each of the first and the second source regions may include an N-type doped region having a plurality of smaller P-type regions formed therein. The plurality of smaller P-type regions may be formed, for example, under a source electrode. Alternatively, each of the first and the second source regions may include alternating strips of N-type doped regions and P-type doped regions. The alternating strips of doped regions may be substantially orthogonal with respect to the JFET region and/or to a source electrode(s) formed above the source regions.

Additionally, the DMOSFET may include a current spreading semiconductor layer. The current spreading semiconductor layer may be formed on a front side of the drift semiconductor layer and the JFET region may be formed on a front side of the current spreading semiconductor layer. The current spreading semiconductor layer may be so formed by epitaxially growing the current spreading semiconductor layer. The current spreading semiconductor layer may include a concentration of first type impurities that is greater than the concentration of first type impurities of the drift semiconductor layer. For example, the current spreading semiconductor layer may be a concentration of first type impurities that is at least one order of magnitude greater than the concentration of first type impurities of the drift semiconductor layer.

A vertical double-implanted metal-oxide semiconductor field-effect transistor (vertical DMOSFET) may include a silicon-carbide substrate. The silicon-carbide substrate may have a first concentration of first type impurities such as, for example, N-type impurities. The vertical DMOSFET may also include a drift semiconductor layer epitaxially formed on a front side of the silicon-carbide substrate. The drift semiconductor layer may have a second concentration of first type impurities less than the first concentration of first type impurities of the silicon-carbide substrate. The vertical DMOSFET may further include a current spreading semiconductor layer epitaxially formed on a front side of the drift layer. The current spreading layer may have a third concentration of first type impurities greater than the second concentration of first type impurities of the drift semiconductor layer. The vertical DMOSFET may also include a first source region, a second source region, and a junction field-effect transistor (JFET) region defined therebetween. The JFET may be formed on a front side of the current spreading semiconductor layer. The JFET region may have a width of about one micrometer. The JFET region may also have a fourth concentration of first type impurities greater than the second concentration of first type impurities of the drift semiconductor layer. The DMOSFET may further comprise a plurality of base contact regions formed in each of the first and the second source regions. The base contact regions being smaller than the first and second source regions. Alternatively, the DMOSFET may further include a plurality of source regions and a plurality of base contact regions. The plurality of source regions and the plurality of base contact regions may form alternating strips of N-type doped regions and P-type doped regions. The alternating strips being substantially orthogonal to respective source electrodes formed over the first and the second source regions.

The above and other features of the present disclosure, which alone or in any combination may comprise patentable subject matter, will become apparent from the following description and the attached drawings.

BRIEF DESCRIPTION OF THE DRAWINGS

The detailed description particularly refers to the following figures, in which.

DETAILED DESCRIPTION OF THE DRAWINGS

Figure 1:
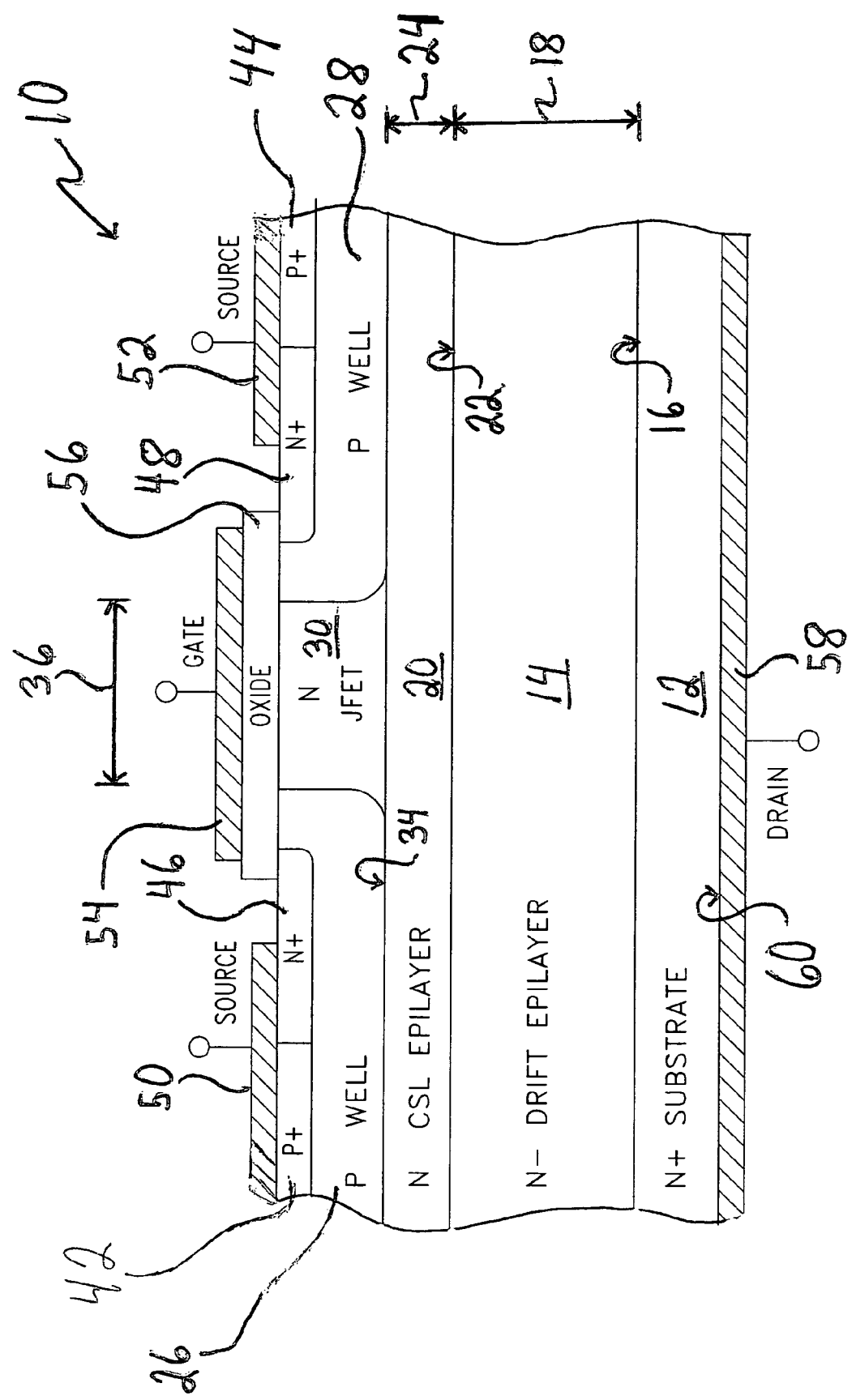
FIG. 1 is a diagrammatic cross-sectional view of one embodiment of a semiconductor device.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

Referring to FIG. 1, a high-voltage power semiconductor device 10 includes a substrate 12 and a number of semiconductor layers successively formed on the substrate 12. Illustratively, the semiconductor device 10 is a vertical double-implanted metal-oxide semiconductor field-effect transistor (DMOSFET). However, in other embodiments, the semiconductor device 10 may be embodied as other types of MOSFET devices. The substrate 12 is illustratively formed from silicon-carbide and doped with an N-type impurity to an "N+" concentration. In some embodiments, the dopant impurities are incorporated into the substrate 12 during the manufacturing of the silicon-carbide wafer from which the substrate 12 is formed. However, in other embodiments, the substrate 12 may be doped with the N-type impurities at a later step in the fabrication process using any suitable doping technique such as, for example, ion implantation or diffusion.

The semiconductor device 10 includes a drift semiconductor layer 14 formed on a front side 16 of the substrate 12. It should be appreciated, however, that one or more "buffer layers" may also be formed between the drift layer 14 and the substrate 12. As such, as used herein the term "formed on a front side of the substrate/layer" is intended to mean formed on a top surface of the substrate/layer and/or formed on the front side of the substrate/layer with respect to the top surface of the substrate/layer with a number of intervening "buffer" layers. Similarly, as used herein, the term "formed on a back side of the substrate/layer" is intended to mean formed on a bottom surface of the substrate/layer and/or formed on the back side of the substrate/layer with respect to the bottom surface with a number of intervening "buffer layers".

In the illustrative embodiment, the drift layer 14 is formed on the front side 16 by epitaxially growing the drift layer 14 on the surface 16. The drift layer 14 may be epitaxially grown on the surface 16 by, for example, a chemical vapor deposition process. The drift layer 14 is also illustratively formed from silicon-carbide and doped with N-type impurities to an "N-" concentration. Illustratively, the drift layer 14 is so doped during the formation of the drift layer 14. The blocking voltage of the semiconductor device 10 is determined, in part, on the thickness 18 and the doping concentration of the drift layer 14. To achieve a desired blocking voltage, these two variables may be modified. For example, the thickness 18 of the drift layer 14 may be increased and/or the doping concentration of the drift layer 14 may be decreased to thereby increase the blocking voltage of the semiconductor device 10. However, when the thickness 18 and/or the doping concentration of the drift layer 14 are decreased, the specific on-resistance of the semiconductor device 10 may be increased as a result thereof. Accordingly, the design process of the semiconductor device 10 may include reiterative design steps of the drift layer 14 and other layers or regions of the device 10 to achieve the desired block voltage while maintaining (or reducing) the specific on-resistance of the semiconductor device 10 as discussed in more detail below.

In one particular embodiment, the semiconductor device 10 has a blocking voltage of about 1000 volts. In such embodiments, the drift layer 14 has a thickness 18 of about 6 micrometers and an N-type doping concentration of about $1 \times 10^{16}$ cm$^{-3}$. However, in other embodiments, drift layers 14 having alternative thicknesses and doping concentrations may be used depending upon the application and design parameters, such as the desired blocking voltage, of the semiconductor device 10.

The semiconductor device 10 also includes a current spreading semiconductor layer 20 formed on a front side 22 of the drift layer 14. In the illustrative embodiment, the current spreading layer 20 is formed on the front side 22 by epitaxially growing (e.g., via chemical vapor deposition) the current spreading layer 20 on the front side 22 to a thickness 24. The current spreading layer 20 is illustratively formed from silicon-carbide and is doped with N-type impurities to an "N" concentration. The current spreading layer 20 may be so doped during the formation of the layer 20 or subsequently thereafter using any suitable doping technique such as, for example, an ion implantation or diffusion process. The current spreading layer 20 is doped to an N-type impurity concentration that is greater than the concentration of the N-type impurities of the drift layer 14. For example, the current spreading layer 20 may be doped to an N-type impurity concentration that is one order of magnitude or greater than the doping concentration of the drift layer 14. In one particular embodiment, the drift layer 14 has a doping concentration of about $1 \times 10^{16}$ cm$^{-3}$ and the current spreading layer 20 has a doping concentration of about $1 \times 10^{17}$ cm$^{-3}$ and a thickness 24 of about 0.4 micrometers.

The semiconductor device 10 also includes two doped semiconductor wells or base regions 26, 28 formed above the current spreading layer 20 and a junction field-effect transistor (JFET) region 30 formed between the wells 26, 28. It should be appreciated that the semiconductor 10 illustrated in FIG. 1 may be a single "transistor cell" and that a completely fabricated transistor device may include any number of semiconductor devices 10. As such, the following description is in regard to but one semiconductor device 10 with the understanding that the description is application to all semiconductor devices 10 that form a fabricated transistor device. For example, the fabricated transistor device may include any number of doped semiconductor wells 26, 28 depending on the number of semiconductor devices 10 included therein. Additionally, it should be appreciated that in some embodiments, the number of semiconductor devices 10 so included in the fabricated transistor device may be arranged in a hexagonal cellular array rather than in an interdigitated finger array.

In the illustrative embodiment, the wells 26, 28 are doped with a P-type impurity to a "P" concentration whereas the JFET region 30 is doped with N-type impurities to an "N" concentration. As such, the JFET region 30 is doped to an N-type impurity concentration that is greater than the concentration of N-type impurities of the drift layer 14. For example, the JFET region 30 may be doped to an N-type impurity concentration that is one order of magnitude or greater than the doping concentration of the drift layer 14. In one particular embodiment, the drift layer 14 has a doping concentration of about $1 \times 10^{16}$ cm$^{-3}$ and the JFET region 30 has a doping concentration of about $1 \times 10^{17}$ cm$^{-3}$.

It should be appreciated that in some embodiments, the JFET region 30 and the current spreading layer 20 have similar doping concentrations. In such embodiments, the wells 26, 28 and the JFET region 30 may be formed by growing an extra-thick current spreading layer 20 and forming the "P" wells 26, 28 using a suitable incorporation process such as an ion implantation process. The doping of the current spreading layer 20 and the JFET region 30 may be performed during the growth process or may be performed subsequently thereafter using, for example, an ion implantation or diffusion process.

Alternatively, in other embodiments, after the current spreading layer 20 is formed on the front side 22 of the drift layer 12, an additional epitaxial layer may be formed on a front side 34 of the current spreading layer 20. In such embodiments, the wells 26, 28 may be formed by, for example, implanting the wells 26, 28 in the additional epitaxial layer using an ion implantation process. The remaining region of the additional epitaxial layer between the wells 26, 28 forms the JFET region 30. The JFET region 30 may be doped, either during fabrication of the additional epitaxial layer or subsequently thereafter, to a doping concentration similar to the doping concentration of the current spreading layer 20. Alternatively, in some embodiments, the JFET region 30 may be doped to a concentration of impurities that is different than the doping concentration of the current spreading layer 20, but still greater than the doping concentration of the drift layer 14. Such a doping concentration of the JFET region 30 may be achieved by doping the additional epitaxial layer to the desired concentration.

By forming a JFET region 30 with a doping concentration that is greater than the doping concentration of the drift layer 14, the specific on-resistance of the semiconductor device 10 may be reduced compared to a MOSFET device having JFET regions and drift layers of substantially equal impurity concentrations. In some embodiments, the JFET region 30 is also fabricated to have a short width 36 relative to a typical DMOSFET device, which may reduce the specific on-resistance of the semiconductor device 10. For example, in some embodiments, the JFET region 30 has a width 36 that is about three micrometers or less. In one particular embodiment, the JFET region 30 has a width 36 of about one micrometer.

Additionally, by forming the current spreading layer 20, the specific on-resistance of the semiconductor device 10 may also be reduced compared to a MOSFET device without a current spreading layer. Because the doping concentration of the current spreading layer 20 is greater than the doping concentration of the underlying drift layer 14, current tends to flow downwardly from the JFET region 30 and laterally through the current spreading layer 20 before subsequently flowing down through the upper portion of the lower doped drift layer 14. Because the current tends to flow laterally through the current spreading layer 20, the current density of the semiconductor device 10 through the lower doped drift layer 14 may be reduced thereby reducing the specific on-resistance of the semiconductor device 10.

It should be appreciated, however, that the increased doping concentration of the JFET region 30 and the current spreading layer 20 may tend to reduce the blocking voltage of the semiconductor device 10. Conversely, the shorter width 36 of the JFET region 30 compared to typical semiconductor device may tend to increase the blocking voltage of the semiconductor device 10 because such a configuration may reduce the magnetic field in the gate oxide layer above the JFET region 30. As discussed above, the doping concentration and thickness 18 of the drift layer 14 may be modified to achieve the desired blocking voltage of the semiconductor device 10. In this way, the design of the semiconductor device 10 involves a number of parameters that may affect or be interdependent upon each other. As such, the design process of the semiconductor device 10 may include a number of reiterative steps of selecting a width 36 and a doping concentration for the JFET region 30, selecting a doping concentration and a thickness for the current spreading layer 20, selecting a doping concentration and a thickness 18 for the drift layer 14, and/or selecting values for other parameters to achieve the desired characteristics of the semiconductor device 10.

As illustrated in FIG. 1, the semiconductor device 10 also includes source regions 46, 48 defined in the "P" wells 26, 28, respectively. The source regions 46, 48 are doped with N-type impurities to a "N+" concentration. The semiconductor 10 also includes base electrode regions 42, 44. The base electrode regions 42, 44 are doped with P-type impurities to a "P+" concentration. The regions 42, 44, 46, 48 may be doped using any suitable doping technique such as, for example, an ion implantation process or the like. A source metallic electrode 50, 52 is formed over the source regions 46, 48, respectively. In some embodiments, the source electrodes 50, 52 are coupled together to form a unitary source electrode. Additionally, in some embodiments, the source electrodes are formed from two or more metallic materials such that one metallic material is coupled with the source regions 46, 48 and a second metallic material is coupled with the base contact regions 42, 44.

The semiconductor device 10 also includes a gate metallic electrode 54 formed on a dielectric layer 56, such as an oxide, over the JFET region 30. The gate electrode 54 and dielectric layer 56 also extend over portions of the source regions 46, 48. The semiconductor device 10 further includes a drain metallic electrode 58 coupled to a bottom surface 60 of the substrate 12. The semiconductor device 10 may be electrically coupled with other electrical devices, sources, or the like via the electrodes 50, 52, 54, 58.

Figure 2:
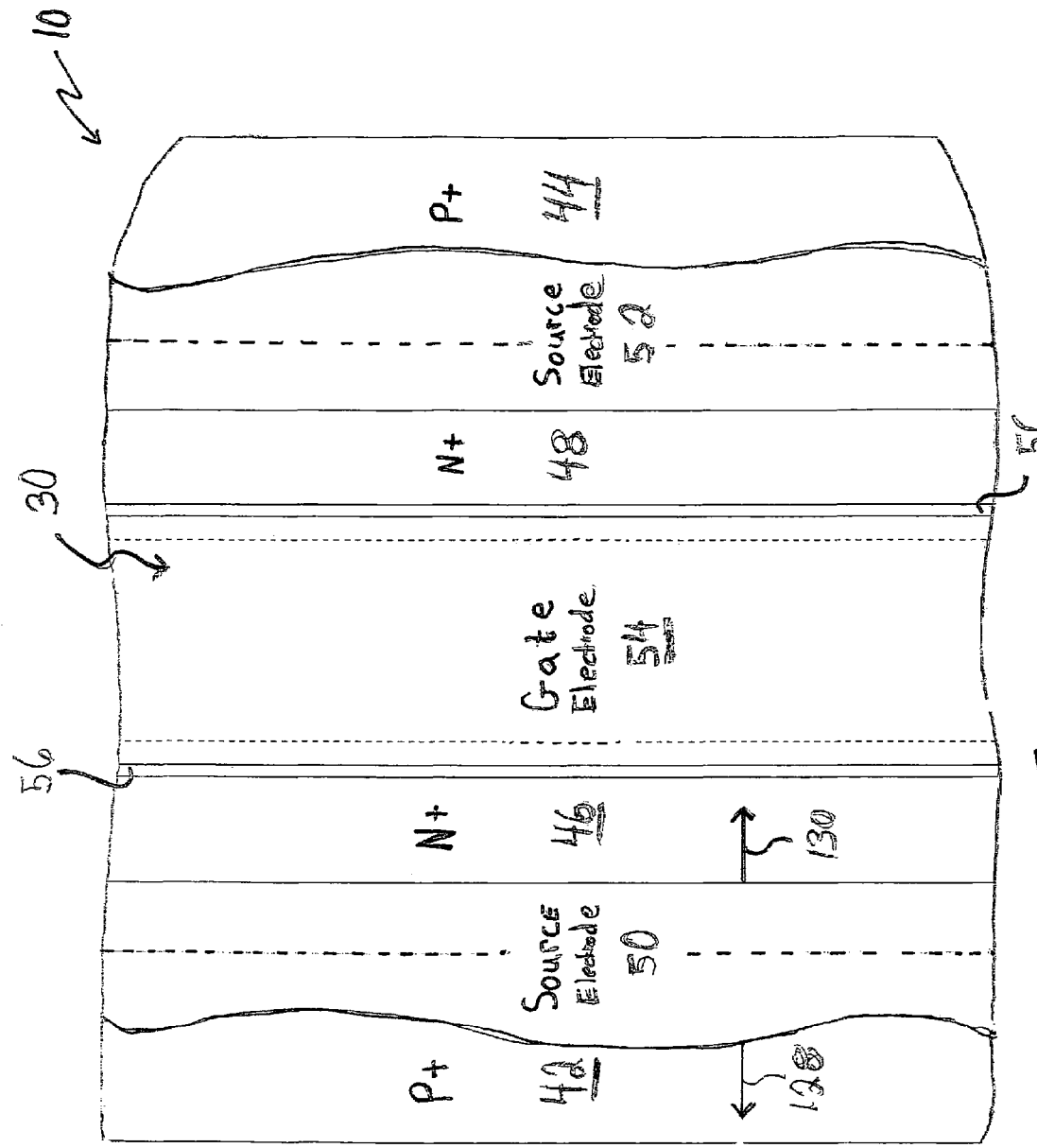
FIG. 2 is a plan view of a portion of the semiconductor device of FIG. 1.

At some point during the design process, the specific on-resistance contribution of a JFET region of a MOSFET device is reduced to a point whereat the source resistance of the device becomes one of the dominating contributions to the specific on-resistance of the device. The source resistance of a device is the resistance between the source electrodes and the inner portions of the source regions. As illustrated in FIG. 2, in one embodiment, the source regions 46, 48 of the semiconductor device 10 and the base contact regions 42, 44 are formed in the "P-" wells 26, 28 such that portions of the source regions 46, 48 and the base contact regions 42, 44 lie under the source electrodes 50, 52, respectively. Note that the outer edges of the source electrodes 50, 52 have been removed in FIG. 2 for clarity. As illustrated, the source regions 46, 48 and the base contact regions 42, 44 extend longitudinally with and substantially parallel to the source electrodes 50, 52 and the JFET region 30.

Because of semiconductor manufacturing process variations, such a topological configuration as illustrated in FIG. 2 can result in an undesirable source resistance if the source regions 46, 48 are misaligned with respect to the base contact regions 42, 44 and/or the source regions 46, 48 are misaligned with respect to the source electrodes 50, 42. For example, with respect to the source region 46, if the source electrode 50 is inadvertently formed more toward the direction of arrow 128 and/or the source region 46 is inadvertently formed more toward the direction of arrow 130, the source electrode 50 may not adequately cover the source region 46 and thereby cause the source resistance of the semiconductor device 10 to be increased due to the misalignment.

Figure 3:
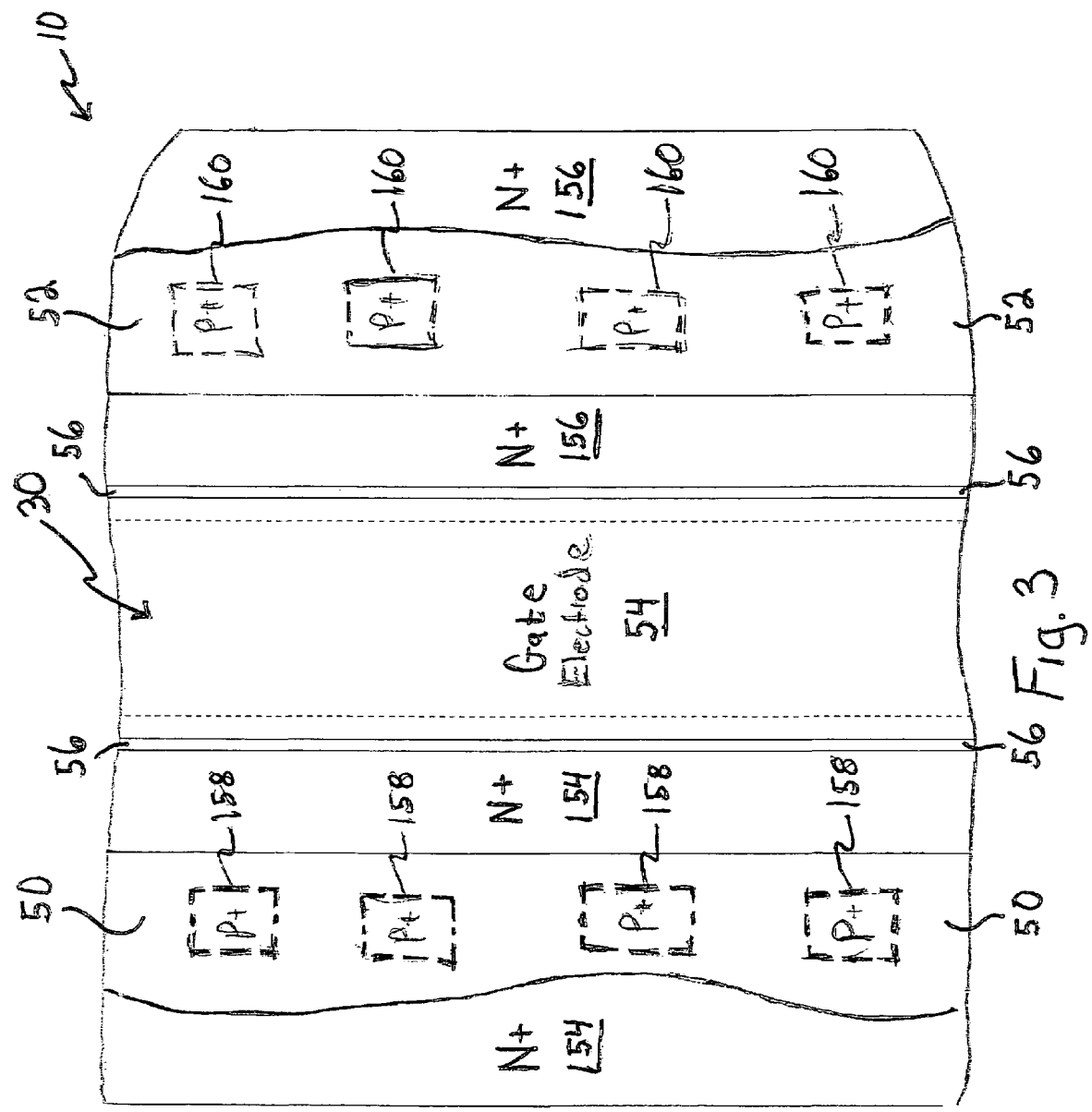
FIG. 3 is a plan view of another embodiment of the semiconductor device of FIG. 1.

Referring now to FIG. 3, to reduce the likelihood of misalignment between the source electrodes and the source regions, in some embodiments, the semiconductor device 10 is fabricated to have source regions 154, 156 that each include a plurality of base contact regions 158, 160 formed in source regions 154, 156, respectively. As shown in FIG. 3, the base contact regions 158, 160 are embodied as small "islands" or regions within the larger source regions 154, 156. The base contact regions 158, 160 are formed to be located in a central location under the source metallic electrodes 50, 52 with areas of source regions 154, 156 spaced between each base contact regions 158, 160. Note that the outer edges of the source electrodes 50, 52 have been removed in FIG. 3 for clarity. Because the source regions 154, 156 form a greater portion of the area under the source electrodes 50, 52, the tolerance to manufacturing variability of the semiconductor device 10 may be increased. That is, even if the source electrodes 50, 52 are slightly misaligned with respect to the source regions 154, 156, the source resistance of the semiconductor device 10 is not substantially increased because a substantial portion of the source regions 154, 156 would remain aligned with the respective source electrode 50, 52.

Figure 4:
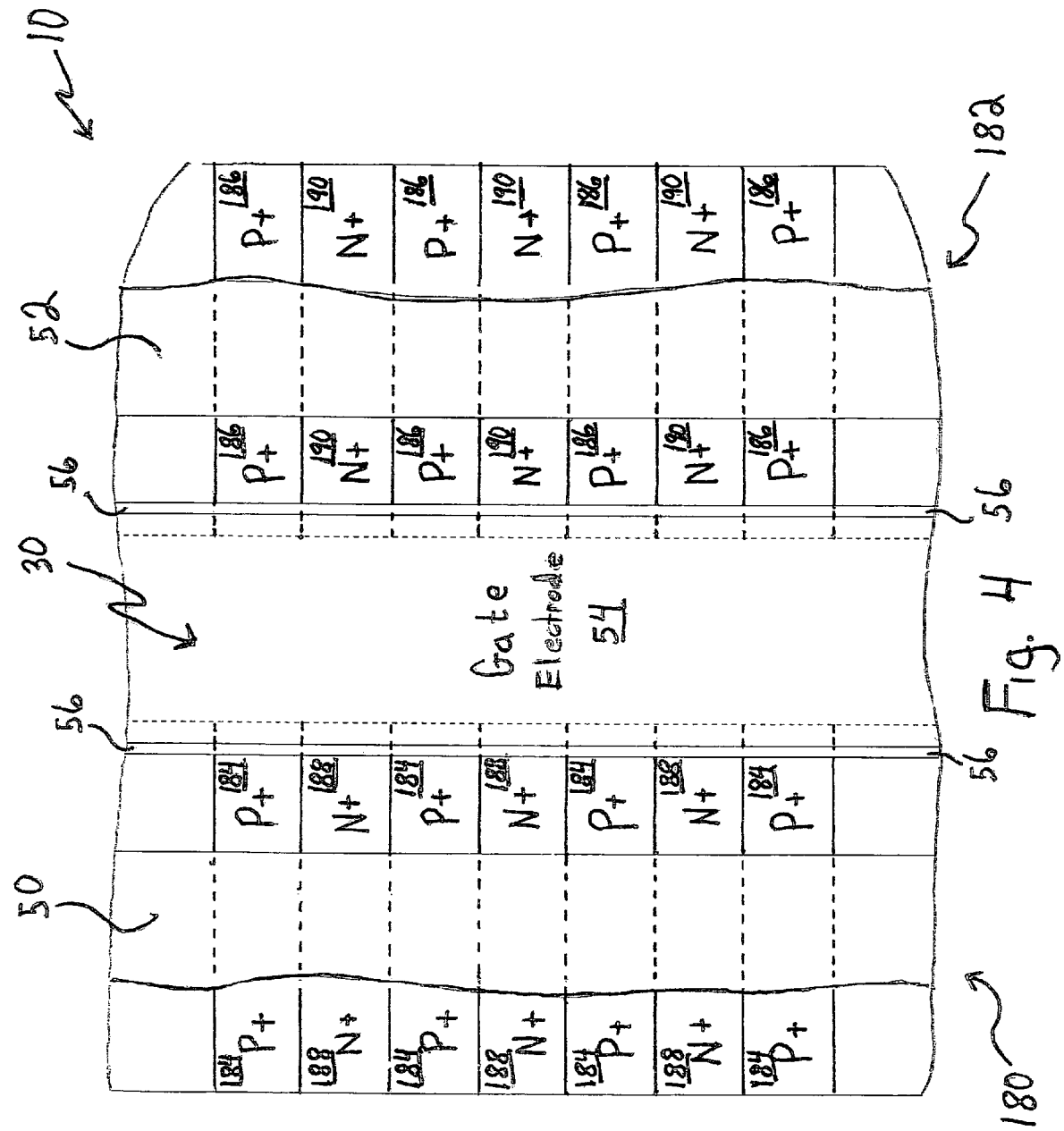
FIG. 4 is a plan view of yet another embodiment of the semiconductor device of FIG. 1.

Referring now to FIG. 4, in another embodiment, the semiconductor device 10 is fabricated to have source regions 188, 190 and base contact regions 184, 186 embodied as strips. The strips alternate between source regions 188, 190 and base contact regions 184, 186. The strips of source regions 188, 190 and base contact regions 184, 186 are orientated such that they are substantially orthogonal to the source electrodes 50, 52 and the JFET region 30. That is, a portion of each of the source regions 188, 190 and base contact regions 184, 186 is positioned under the respective source electrode 50, 52. Because the source regions 188, 190 and base contact regions 184, 186 are configured substantially orthogonal to the source electrodes 50, 52, if any one or more of the source electrodes 50, 52 are fabricated to be slightly misaligned (e.g., the source electrode 50, 52 is closer to or farther away from the gate electrode 54), a substantial portion of each source regions 188, 190 and base contact regions 184, 186 would remain under the respective source electrode. As such, the source resistance of the semiconductor device 10 is not substantially increased when the source electrodes 50, 52 and/or the source regions 188, 190 are slightly misaligned during fabrication of the device 10.

It should be appreciated that the semiconductor 10 may be fabricated using any one of a number of fabrication techniques. For example, in one embodiment, the semiconductor 10 may be fabricated using any one of the semiconductor fabrication methods described in U.S. Utility patent application Ser. No. 11/338/043 entitled "Method for Fabricating a Semiconductor Device," which was filed on Jan. 23, 2006 by James A. Cooper et al., the disclosure of which is expressly incorporated herein by reference.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the device described herein. It will be noted that alternative embodiments of the device of the present disclosure may not include all of the features described yet still benefit from at least some of the advantages of such features. Those of ordinary skill in the art may readily devise their own implementations of the device that incorporate one or more of the features of the present invention and fall within the spirit and scope of the present disclosure as defined by the appended claims.

The invention claimed is:

1. A metal-oxide semiconductor field-effect transistor comprising:
 a silicon-carbide substrate having a first concentration of first type impurities;
 a drift semiconductor layer formed on a front side of the semiconductor substrate and having a second concentration of first type impurities less than the first concentration of first type impurities;
 a current spreading semiconductor layer formed on a front side of the drift semiconductor layer;
 a first source region;
 a second source region;

a JFET region formed on a front side of the current spreading semiconductor layer and defined between the first source region and the second source region, the JFET region having a third concentration of first type impurities that is greater than the second concentration of first type impurities;

a plurality of source regions; and a plurality of base contact regions, wherein the plurality of source regions and the plurality of base contact regions form alternating strips of N-type doped regions and P-type doped regions, the alternating strips being substantially orthogonal to respective source electrodes formed over the first and the second source regions.

2. The metal-oxide semiconductor field-effect transistor of claim 1, wherein the JFET region has a width of less than about three micrometers.

3. The metal-oxide semiconductor field-effect transistor of claim 2, wherein the JFET region has a width of about one micrometer.

4. The metal-oxide semiconductor field-effect transistor of claim 1, wherein the third concentration of first type impurities is at least one order of magnitude greater than the second concentration of first type impurities.

5. The metal-oxide semiconductor field-effect transistor of claim 1, wherein the current spreading semiconductor layer has a fourth concentration of first type impurities that is greater than the second concentration of first type impurities.

6. The metal-oxide semiconductor field-effect transistor of claim 5, wherein the fourth concentration of first type impurities is at least one order of magnitude greater than the second concentration of first type impurities.

7. The metal-oxide semiconductor field-effect transistor of claim 6, wherein the JFET region has a width of about one micrometer.

8. The metal-oxide semiconductor field-effect transistor of claim 1, further comprising a plurality of base contact regions formed in each of the first and the second source regions, the base contact regions being smaller than the first and second source regions.

9. A double-implanted metal-oxide semiconductor field-effect transistor comprising:

a silicon-carbide substrate;

a drift semiconductor layer formed on a front side of the semiconductor substrate;

a first source region;

a first source electrode formed over the first source region, the first source electrode defining a longitudinal axis;

a plurality of first base contact regions defined in the first source region, each of the plurality of first base contact regions being spaced apart from each other in a direction parallel to the longitudinal axis defined by the first source electrode;

a second source region;

a second source electrode formed over the second source region, the second source electrode defining a longitudinal axis;

a plurality of second base contact regions defined in the second source region, each of the plurality of second base contact regions being spaced apart from each other in a direction parallel to the longitudinal axis defined by the second source electrode; and a JFET region defined between the first source region and the second source region, the JFET region having a width less than about three micrometers.

10. The double-implanted metal-oxide semiconductor field-effect transistor of claim 9, wherein the JFET region has a width of about one micrometer.

11. The double-implanted metal-oxide semiconductor field-effect transistor of claim 9, wherein the JFET region has a first concentration of first type impurities and the drift semiconductor layer has a second concentration of first type impurities, the first concentration of first type impurities being greater than the second concentration of first type impurities.

12. A double-implanted metal-oxide semiconductor field-effect transistor comprising:

a semiconductor substrate;

a drift semiconductor layer formed on a front side of the semiconductor substrate;

a current spreading semiconductor layer formed on a front side of the drift semiconductor layer;

a plurality of first and second source regions;

a plurality of base contact regions; and a JFET region defined between the plurality of first source regions and the plurality of second source regions, the JFET region being formed on a front side of the current spreading semiconductor layer, wherein the plurality of first and second source regions and the plurality of base contact regions form alternating strips of N-type doped regions and P-type doped regions, each of the alternating strips defining a longitudinal axis that is substantially orthogonal to a longitudinal axis defined by respective source electrodes formed over the first and the second source regions.

13. The double-implanted metal-oxide semiconductor field-effect transistor of claim 12, wherein the current spreading semiconductor layer has a first concentration of first type impurities and the drift semiconductor layer has a second concentration of first type impurities, the first concentration of first type impurities being greater than the second concentration of first type impurities.

14. The double-implanted metal-oxide semiconductor field-effect transistor of claim 13, wherein the first concentration of first type impurities is at least one order of magnitude greater than the second concentration of first type impurities.

15. The double-implanted metal-oxide semiconductor field-effect transistor of claim 12, wherein the JFET region has a width of about three micrometers or less.

* * * * *